United States Patent [19]

Pickens et al.

[11] Patent Number: 5,604,894
[45] Date of Patent: *Feb. 18, 1997

[54] MEMORY MANAGEMENT SYSTEM FOR CHECKPOINTED LOGIC SIMULATOR WITH INCREASED LOCALITY OF DATA

[75] Inventors: Daniel C. Pickens, Dallas; Patrick W. Bosshart, Plano, both of Tex.

[73] Assignee: Texas Instruments Incorporated, Dallas, Tex.

[ * ] Notice: The term of this patent shall not extend beyond the expiration date of Pat. No. 5,604,889.

[21] Appl. No.: 473,841

[22] Filed: Jun. 7, 1995

Related U.S. Application Data

[62] Division of Ser. No. 259,845, Jun. 15, 1994.

[51] Int. Cl.$^6$ .................................................. G06F 12/08
[52] U.S. Cl. ........................ 395/500; 395/403; 395/449; 364/243.41
[58] Field of Search .................................. 395/403, 449, 395/461, 463, 500; 364/243.41

[56] References Cited

U.S. PATENT DOCUMENTS

| | | | |
|---|---|---|---|
| 4,797,814 | 1/1989 | Brenza | 364/200 |
| 4,811,203 | 3/1989 | Hamstra | 395/463 |
| 4,862,347 | 8/1989 | Rudy | 364/243 |
| 4,905,139 | 2/1990 | Asai et al. | 395/463 |
| 4,905,141 | 2/1990 | Brenza | 364/243.41 |
| 4,924,429 | 5/1990 | Kurashita et al. | 364/578 |
| 4,926,316 | 5/1990 | Baker et al. | 364/246 |
| 4,943,914 | 7/1990 | Kubo | 395/449 |
| 5,008,786 | 4/1991 | Thatte | 364/200 |
| 5,025,366 | 6/1991 | Baror | 395/461 |
| 5,125,085 | 6/1992 | Phillips | 395/449 |
| 5,134,696 | 7/1992 | Brown et al. | 395/463 |
| 5,142,488 | 8/1992 | Chan et al. | 364/728.06 |
| 5,224,217 | 6/1993 | Zangenehpour | 395/463 |
| 5,283,876 | 2/1994 | Tague | 395/425 |
| 5,285,323 | 2/1994 | Hetherington et al. | 395/449 |
| 5,293,609 | 3/1994 | Shih et al. | 395/463 |
| 5,386,547 | 1/1995 | Jouppi | 395/449 |
| 5,392,416 | 2/1995 | Doi et al. | 395/449 |
| 5,394,531 | 2/1995 | Smith | 395/463 |
| 5,432,919 | 7/1995 | Falcone et al. | 395/461 |
| 5,434,992 | 7/1995 | Mattson | 395/463 |
| 5,455,929 | 10/1995 | Bosshart et al. | 395/500 |

*Primary Examiner*—Kevin J. Teska
*Assistant Examiner*—Tyrone V. Walker
*Attorney, Agent, or Firm*—W. Daniel Swayze, Jr.; W. James Brady, III; Richard L. Donaldson

[57] ABSTRACT

A memory management system for use with a logic simulator 10 for storing data in each memory that is being simulated by the logic simulator 10. The system includes memory control logic 14 coupled to a physical memory 16 which is segmented into a permanent storage area P (26), a temporary storage area T1 (24) and a second temporary storage area T2 (22). Each write request from the simulator causes memory control logic 14 to store the latest request into the T2 area (22). Prior data stored in T2 (22) are first moved to the T1 (24) or P (26) storage area where other store requests for the same and other simulated locations were stored during the same simulator time interval. In this fashion, a history of simulator write activity is stored in physical memory 16 and available for rerunning or restarting the simulator 10 at or near a prior simulator cycle.

9 Claims, 5 Drawing Sheets

MEMORY MANAGEMENT SYSTEM FOR CHECKPOINTED LOGIC SIMULATOR WITH INCREASED LOCALITY OF DATA

This is a division, of application Ser. No. 08/259,845, filed Jun. 15, 1994.

RELATED APPLICATIONS

This patent application is related to U.S. patent application Ser. No. 08/112,906 filed Aug. 26, 1993 which is a continuation of U.S. patent application Ser. No. 530,716 filed May 29, 1990, now abandoned. This application is also related to U.S. patent application Ser. No. 08/136,520 filed Oct. 14, 1993, now U.S. Pat. No. 5,455,929.

FIELD OF THE INVENTION

This invention relates generally to the field of logic simulators and more specifically to logic simulators for performing very long logic simulations of logic networks which include digital memories.

BACKGROUND OF THE INVENTION

Logic simulators have been used for many years by designers to test the integrity of their logic designs without requiring building and testing of the actual logic design. The logic simulator simulates the functions performed by the specific design and provides the design engineer with an opportunity to examine the signals generated by the logic design and the data values stored in the memory associated with the logic design. From an analysis of the simulated signals and the data stored in simulated memory, the designer may uncover design flaws. By using an iterative approach to logic design, the logic designer can make logic changes and then simulate that design to test its performance to determine if a detected design flaw has been corrected without introducing further design flaws.

The above described design approach utilizing logic simulators has proved to be best suited for relatively simple logic simulations. When one attempts to simulate very complex logic networks, however, the simulator running time may increase to one which takes many hours and for more complex logic networks, the simulation may take many days to complete. This is due primarily to the greater number of circuits being simulated. During simulations of this sort, some of the simulation data is placed in a simulation trace file. In the event an error is detected in the logic network being simulated, the logic designer typically has to rely on data in the trace file to determine what has caused the error. Since the amount of data available in the trace file is typically limited, in many instances the trace file does not have the data required by the logic designer to determine the cause of the error. Accordingly, the logic designer may have to run the simulation over again while producing a different trace file in order to identify the source of the detected failure.

In searching for a solution to the above mentioned problems, a checkpoint scheme has been developed which allows the designer to rerun a simulation starting at a desired checkpoint thereby making it easier to observe simulated signals at different times. This technique involves periodically storing or archiving the data signal values and memory data values for selected simulator cycles and discarding the data signals and memory values for the times that are not selected to be saved or checkpointed. As such, checkpointing allows the designer to rerun a simulation starting at many but not all previously simulated machine cycles. If the exact machine cycle desired is not checkpointed, then the designer must select the nearest earlier checkpoint at which to start rerunning the simulation. This approach, however, like many others tried earlier, requires a very large number of storage locations in order to provide checkpointing. Hence, the number of simulation cycles that can be effectively evaluated and rerun using this checkpointing approach is limited by the amount of checkpoint memory available to the simulator.

The problem of availability of physical memory for storing data signals becomes much more acute when the network being simulated includes one or more memories to be simulated. In existing simulators, each simulated memory location written to by the logic network during the course of a simulation requires at least a comparable amount of physical memory for storing simulated data. As the size and number of the simulated memories increase, the size of the logic network connected thereto typically becomes larger as well. This will cause the simulation run time to become longer and the physical memory requirements of the simulator to increase. Ultimately, physical memory size limitations of the simulator prevent the simulator from performing uninterrupted simulations of any desired length.

One solution to this problem is to utilize mass storage devices as virtual memory to store data signal information and simulated memory data for previously executed simulation cycles when the physical memory becomes filled with data. While this solution will overcome the absolute limitation which previously was presented by filling all physical memory locations, the use of virtual memory creates another problem, namely, simulation run time may become greatly magnified due to the time required to fetch data from the virtual memory which may have been written to mass storage device during a paging process.

Other problems have become apparent in prior simulators as well. For example, when checkpointing is utilized, the physical memory locations freed by this process becomes available for reassignment to subsequent simulated memory writes. Indeed, locations in physical memory are used and freed many times during the course of the simulation. As a result, the physical location of the data for adjacent simulated locations may be in vastly different physical positions in memory. When these portions of physical memory need to be moved to virtual memory on a mass storage device such as a disk, usually a segment of physical memory consisting of many physical memory locations known as a page is transferred to the disk. This means that the data for adjacent simulated memory locations may reside in different pages on the disk. Then, when the simulator needs to access or change such adjacent memory locations, the simulation is slowed down by having to move the two desired pages of data from the disk to the physical memory before the reading or updating can occur. As the simulation run becomes longer, such swapping of pages known as paging of data becomes more frequent and the simulation run time dramatically increases.

SUMMARY OF THE INVENTION

The present invention comprises a logic simulator coupled to a memory control system which responds to simulated memory write (store) requests from the simulator and writes the data to the physical memory in a manner which improves the locality of data storage and reduces the need for paging with virtual memory. The term locality as used herein means that data stored during adjacent time periods to different simulated memory locations will be arranged in physical memory in substantially adjacent locations. By doing so, data that is stored during adjacent time periods in the simulated memory of the logic network being simulated is stored in physical memory substantially within the boundaries of the pages of data which are maintained in the physical memory or are fetched from virtual storage by the memory control system of the simulator.

The memory control separates physical memory storage cells into three areas: temporary one (T1), temporary two (T2) and permanent (P). The T2 storage area is reserved for storing data associated with the most recent simulated write to each location written to in the memory being simulated. The T1 storage area is reserved for storing data associated with earlier writes to simulated memory locations where more than one write had previously been performed to that simulated memory location. Additionally, the T1 storage area also preserves all previous writes to each simulated memory location written to during each of a plurality of previously executed blocks of simulator cycles known as a hypergroup. This allows the simulation to be rerun starting at a previous time if data for that time is still in memory. Because the physical memory rapidly fills with simulation data, the T1 storage area may need to be checkpointed. When a block of T1 storage area is checkpointed, the most recent store to each location written to during the block of simulator cycles (hypergroup) is stored in permanent P storage.

The data stored for each simulated memory location written to during the simulation includes the data sought to be stored by the logic simulator. In addition, an indication is stored as to the simulation cycle during which the memory store was requested by the simulator. Also, a pointer is stored to identify the next previous store to that specific simulated memory location within the current block of simulation cycles (hypergroup). Where no previous write has occurred to a particular simulated memory location, the pointer is set to nil.

Locality is improved by the present invention and hence paging is reduced thereby keeping runtime of simulations as low as possible. Locality is improved by a number of features of the invention. First, the latest data stored to any simulated memory location is always maintained in the T2 area of physical memory. The T2 area is assigned as the simulation progresses and constitutes one or more contiguous areas of physical memory. Adjacent locations in T2 correspond to simulated memory locations that were first accessed one after the other. Accordingly, if a simulation is to be rerun, the simulated memory locations are available in T2 space and are likely to be in the same page as they were first filled in the order as occurred during the simulation run.

Second, the prior stores to simulated memory are stored in T1 space which is assigned specifically for storing all writes occurring during a hypergroup of cycles. When the hypergroup has been in physical memory for a period of time which for the present invention is usually in the order of 50,000 simulation cycles, the data in the T1 area is checkpointed. This means that the most recent simulated write to each location written to during the simulation run is moved to the P storage area and then all the locations in T1 for that hypergroup are freed and made available for a new hypergroup to utilize. In this way, T1 space is always made available in the form of blocks of free space (free pages). As such, as the simulation progresses, the data placed into T2 is physically located within a page of physical memory. If that space is exceeded, however, another page will be assigned to T1 space, however, it may not necessarily be contiguous with the page where earlier simulated writes are stored within the same hypergroup of simulation cycles.

DETAILED DESCRIPTION

Figure 1:
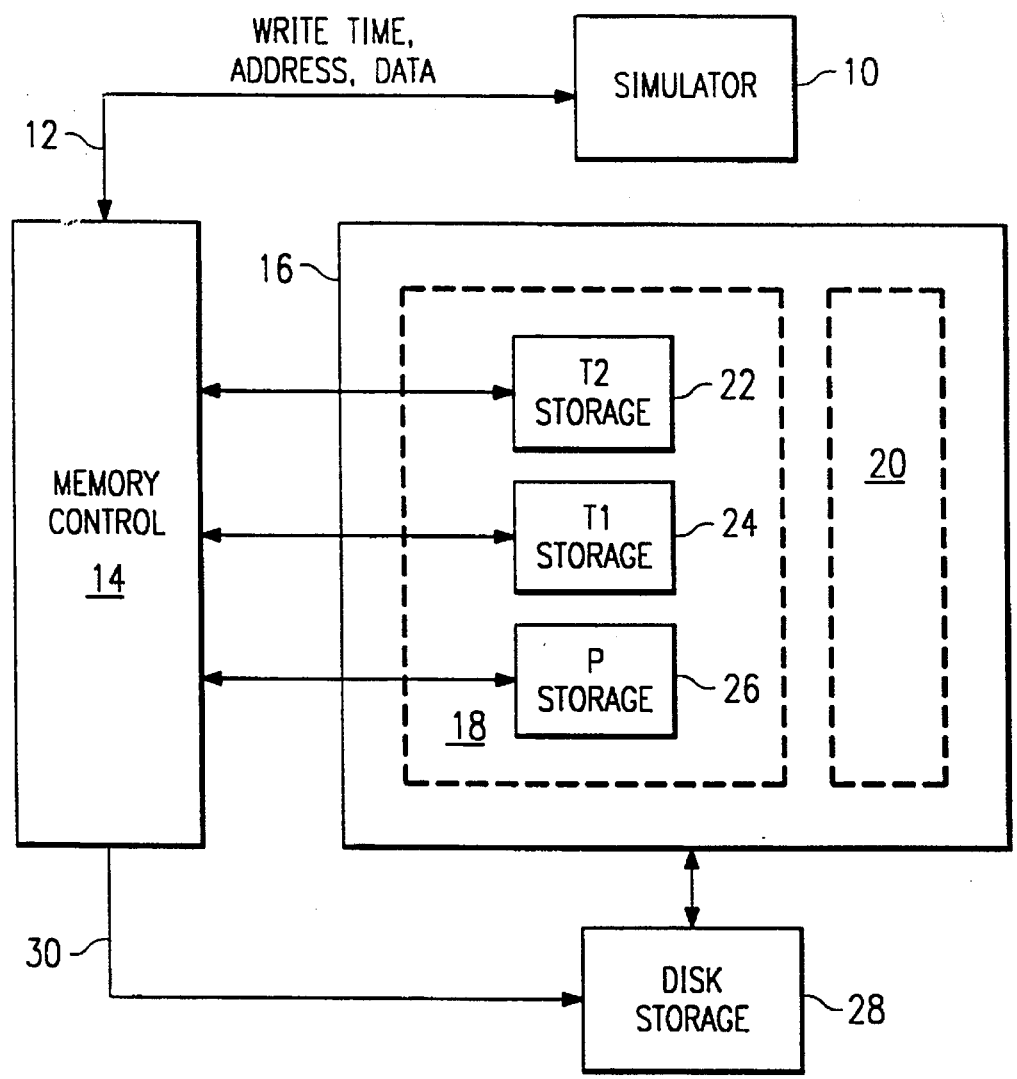
FIG. 1 illustrates a block diagram of the memory management system of the present invention.

Referring first to FIG. 1, the memory management system for managing simulated memory data of the present invention is coupled to a logic simulator 10 of the type well known in the art. The simulator 10 is utilized by design engineers to test the operation of logic designs without having to actually construct the circuit to test it. The designs that can be tested frequently include logic networks which are coupled to one or more memory devices that also need to be simulated. The logic networks are simulated by utilizing models of the circuits to predict the network behavior. This approach is effective, however, a different approach is required for simulating memory. As such, the simulator 10 needs a mechanism for storing and retrieving data from one or more simulated memories coupled to the network being simulated in the simulator 10.

In order to simulate memory connected to the logic network being simulated by the simulator 10, the simulator 10 has a intercommunication bus 12 coupled between the simulator 10 and the memory control logic 14. Coupled to the control logic 14 is a physical memory 16 which has a plurality of areas therein illustrated by dotted lines 18 and 20. Each physical area 18 and 20 is reserved for storing data associated with a different simulated memory in the logic network being simulated in the simulator 10. While the following discussion will concentrate on area 18, it will be understood that the organization of area 20 is the same as that for area 18. It is also intended that additional areas other than 18 and 20 can be used to simulate additional memories in the logic network being simulated.

The intercommunication bus 12 is utilized to transmit both simulated read and write requests between the simulator 10 and the memory control logic 14. When a simulated read request is generated by the simulator 10, that request is received by the memory control logic 14 via the line 12. The memory control logic 14 fetches the data from the T2 storage area 22 for the address received over the intercommunication bus 12. That data is then transmitted to the simulator 10 over the line 12. As will become apparent, the T2 storage area 22 is used to store the most recent data stored by the simulator 10 to any particular address in a memory being simulated. Accordingly, any request for data from the simulator 10 should cause the memory control logic 14 to fetch data from the T2 area for the memory being simulated.

When a simulated write or store request is generated by the simulator 10, than request is transmitted to the memory control logic 14 over the line 12. The memory control logic 14 also receives over line 12 a simulated memory address to which the data is to be stored. The memory control logic 14 additionally receives over line 12 the data to be stored and the simulator time during which the store request was generated. This data and simulator time is frequently referred herein as a time value pair. The memory control logic 14 stores the time value pair in the physical T2 storage area 22 assigned for simulating the address received over the intercommunication bus 12 in a manner hereinafter described in greater detail.

The physical memory area 18, as illustrated in FIG. 1, is divided into several different physical storage areas, namely, temporary storage T1 (24), temporary storage T2 (22) and permanent storage P (26). As already noted, the T2 storage area is for the most recent data stored in each location in the memory being simulated. The T1 storage area, however, comprises a plurality of physical areas, each containing the prior data stored to each location in the simulated memory during each of a period of time ranges in the simulation (hypergroup). It is preferred that the time ranges for each period is in the order of 10,000 simulation cycles although other values may be selected as well. This means, for example, that if the simulator is currently running the 15,000th simulation cycle, an area within T1 will have been established for storing all the data stored to memory during the first 10,000 simulation cycles and a second area within T1 will be filling with data being stored in the simulated memory during the second 10,000 simulation cycles. In the preferred arrangement, the T1 area of physical memory 18 will expand in size to accommodate additional stores of data to the simulated memory until a total of 5 storage areas for storing the data associated with 5 blocks or hypergroups of simulator cycles of 10,000 cycles have been assigned. Those of skill in the art will realize that the selection of five 10,000 cycle periods as the number and size of each time period stored in the simulated memory is an arbitrary choice and that a fewer or greater number of periods could be maintained in memory and that the number of cycles in each period could be changed to suit user needs.

In the preferred embodiment, once the five periods of 10,000 cycles have been completed, the T1 memory space needs to be archived in some way to reduce the amount of physical storage being occupied by previously stored simulated data. In addition, it should be recognized that if the design engineer desires to rerun a simulation starting at an earlier time, such rerunning is frequently run at times within the most recently executed 50,000 simulation cycles. Hence, there is relatively little need to store more that the data for the most recently executed 50,000 simulation cycles.

The data in the simulated memory is said to be checkpointed out of the T1 storage area when that data is archived into the P storage area. When stored simulated memory data for a given period of 10,000 cycles is checkpointed or archived, the memory control logic 14 causes the most recent time value stored to each simulated memory location stored to during that 10,000 cycle period to be placed in a P storage area which is identified by the 10,000 cycle period it archives. The first time simulated data for a given simulated memory location is checkpointed, the pointer associated with that time value pair is set to nil. Each subsequent time simulated data for a given simulated memory location is checkpointed, the pointer associated with that time value pair is set to the physical address of the next previously checkpointed data in P for that given simulated memory location. The only exception to this occurs when the most recent store to a location occurs within the 10,000 cycle period that is being checkpointed and that simulated location has not yet been stored to again. Hence, the most recent data stored to that simulated location is in the physical T2 storage area. Any subsequent storage to that simulated location, however, will cause the data in T2 to be placed in the appropriate P area.

As is readily apparent, as a simulation progresses, the amount of data that needs to be stored grows. It is clear that in most cases the T1 area is generally the smallest area and that the T2 area is much larger than that. The P area initially is void but as the simulation becomes longer, the size of the P area expands as well and, with long simulations, the P storage area will become much larger than the T1 and T2 areas. Eventually, the physical memory 16 may become filled. To accommodate this, the system of FIG. 1 includes a disk storage unit 28 which is under the control of the memory control logic 14 via the control line 30. When all available space has been used within physical memory 16, large blocks or pages of data can be copied from the P storage area of physical memory 16 and placed on the disk storage 28. Then, the space in the P storage area is freed so that it can be subsequently filled with newer data. Should the data in the disk storage 28 be needed at a later time, pages or blocks of P storage area in the physical memory 16 can be swapped with the needed data from the disk storage 28.

Figure 2:
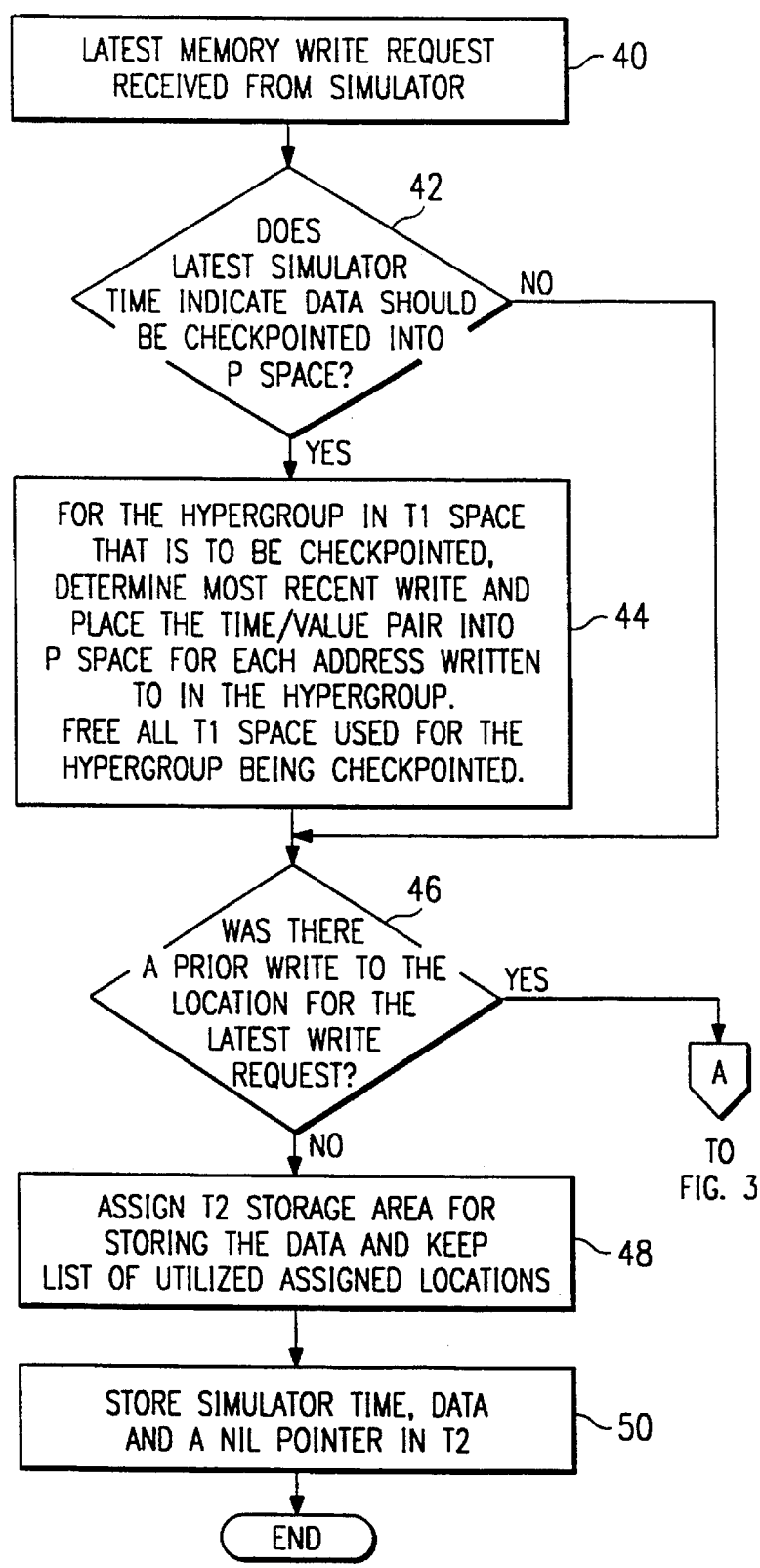
FIGS. 2–4 illustrate in flow chart form the operation of the system illustrated in FIG. 1.
Figure 3:
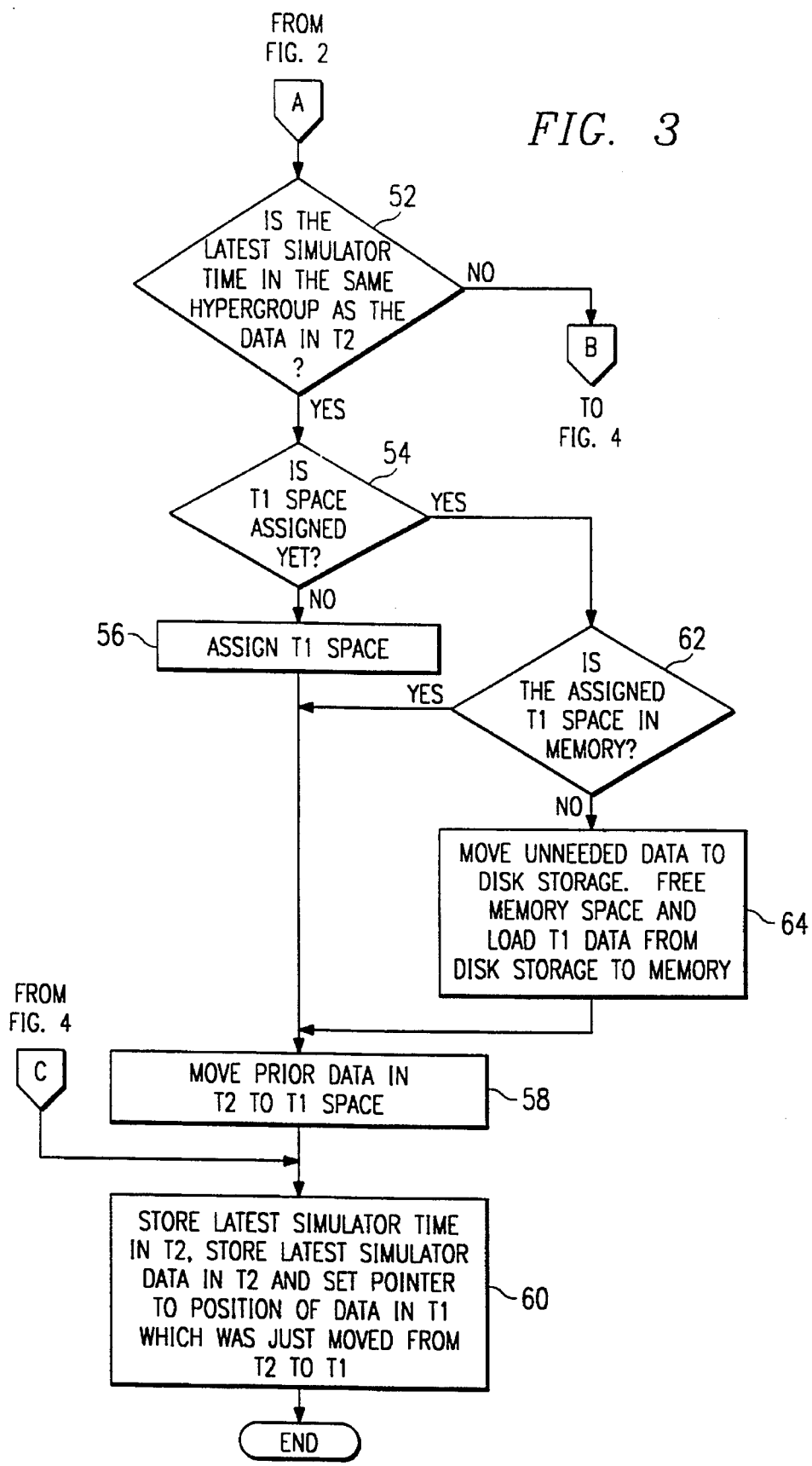
Figure 4:
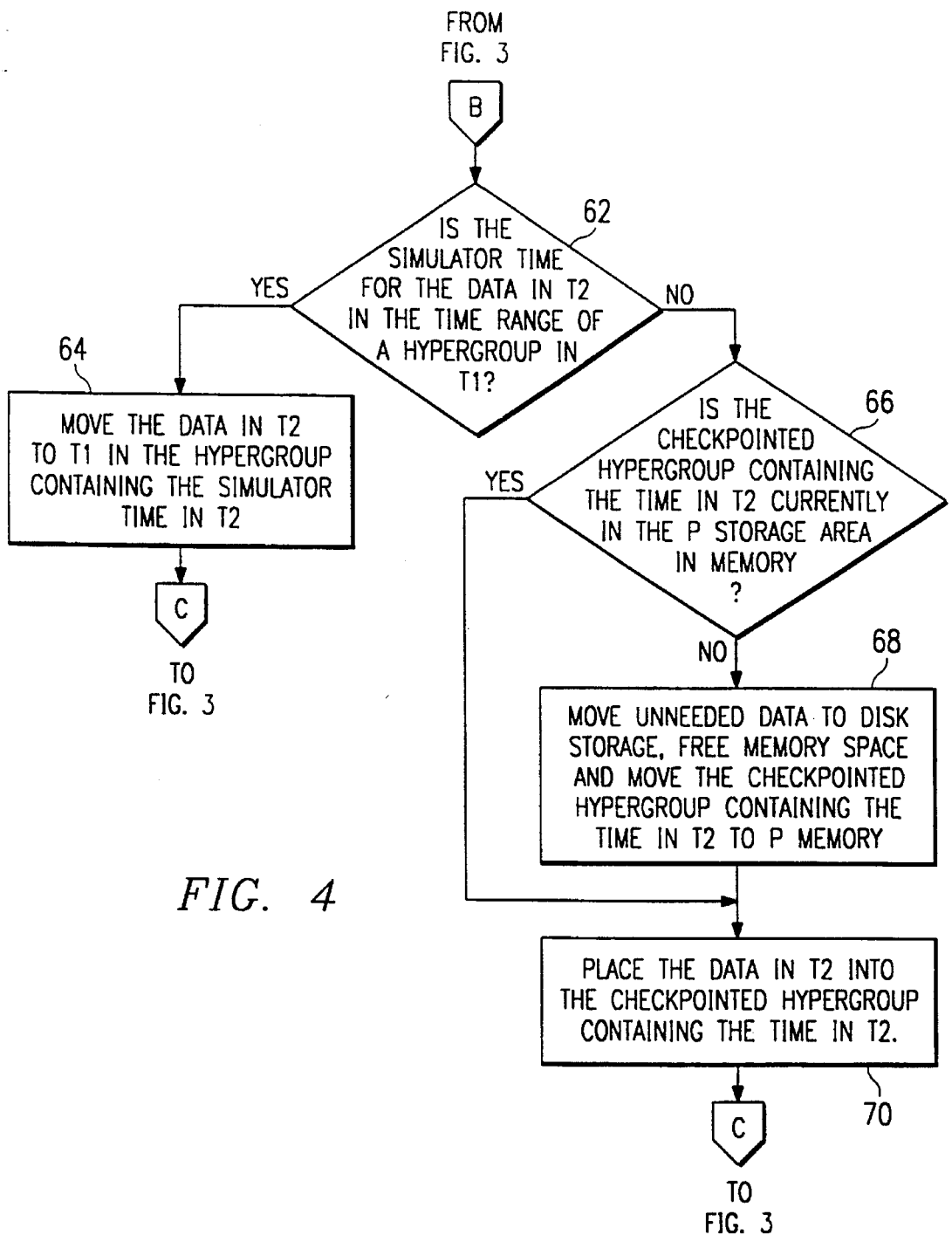

While the above description describes in general the operation of the system illustrated in FIG. 1, a much greater understanding of the system operation is provided in connection with the flow charts of FIGS. 2–4. In particular, reference is first made to FIG. 2. A simulated memory write request is received by the memory control logic 14 of FIG. 1 as illustrated at 40 in FIG. 2. Each simulated write request received from the simulator 10 includes the simulated address to which data is to be stored, the simulated data to be stored and simulation time at which the write request was initiated by the simulator 10. The memory control logic 14 responds to this information and stores the simulated data at a physical location, different from the simulated address, from which it can be retrieved if the simulator subsequently requests this data. The specific control and organization of the data in the physical memory will become clear from the following detailed discussion.

After receipt of the latest simulated memory write request, the memory control logic 14 first determines, from the simulation time received with the request, if data is already in physical memory should be checkpointed (archived). This is illustrated by decision block 42. For the time being, however, it will be assumed that the simulation has just begun and that data does not need to be checkpointed and that the decision of block 42 is a "No". The decision to checkpoint or the "Yes" answer to decision block 42 will be discussed later.

After making the decision that no checkpointing is required at this time, the memory control logic 14 next determines as illustrated in decision block 46 if a previous simulated write has occurred to the simulated memory location, for example, location 1, identified in the latest write request received from the simulator 10. Assuming again that the simulation has just begun, a prior write to that location (location 1) has not occurred so the answer to decision block 46 is "No". This means that the memory control logic 14 must assign a temporary physical storage area T2 for storing data associated with the specific address to which the simulated storage request is directed. This is illustrated by operation block 48. Thereafter, as illustrated by operation block 50, a time value pair is stored in T2 and a pointer associated therewith is set to a nil pointer. The nil pointer indicates that there are no other time value pairs in the current or any other earlier hypergroup. The time value pair consists of the simulator time and the data to be stored as received from the simulator 10. The memory control logic 14 also establishes a list to identify where these three entries (time, value, pointer) for the simulated storage request are placed in the physical T2 storage area memory so it can be subsequently retrieved. Thereafter, the memory control logic 14 ends its operation and returns to a "wait" state waiting for a subsequent read or write request from the simulator.

For ease of understanding, a subsequent request from the simulator to store different data at the same simulated memory location (location 1) is now assumed to have occurred. The memory control logic 14 will respond to this data store request by executing the events in the flow chart of FIG. 2 within blocks 40, 42, 46 and exit through the connection point A to FIG. 3. The next operation performed by the logic control 14 is depicted in decision block 52 wherein the time associated with the latest write request is analyzed to determine if it is in the same hypergroup as the data in T2. The term hypergroup, as used herein, refers to a block of N simulator cycles where N is an integer which, in the preferred embodiment of this invention, is 10,000 simulator cycles. Accordingly, decision block 52 determines if the current storage request simulator time is in the same 10,000 simulator cycle block as the data previously stored in T2. If the answer to this question is "Yes", which is assumed to be the actual answer for the facts under discussion, memory control logic 14 will respond to this "Yes" answer by executing another decision as illustrated in decision block 54. In this decision block 54, the memory control logic 14 determines if T1 space has previously been assigned for the simulated memory address being written to.

Since the current store to simulated memory is assumed to be only the second store to that location (location 1) since the simulation began, the decision of decision block 54 is "No" and the memory control logic 14 moves on to process block 56. In process block 56, the memory control logic 14 assigns a block of physical memory space for storing T1 data for the simulated memory address in the current store to memory request and many later executed simulated storage requests occurring during the same 10,000 cycle hypergroup. Then process passes to block 58 where the memory control logic 14 causes the simulation data previously stored in T2 to be moved to T1 at a physical location which is maintained in a list to identify where in memory this data was stored. Thereafter, control shifts to block 60 where the current store request data from the simulator 10 is stored in the location in T2 from which the data moved to T1 came. As such the latest data and the simulator time of the latest store request for this location (location 1) is placed in T2. The pointer associated therewith is set to the physical address in T1 where the simulation data previously in T2 had been moved to. Once this task is completed, the memory control logic 14 goes into a wait state waiting for another read or write request from the simulator 10.

Assuming now that a third store request is generated by the simulator within the same hypergroup as the previous two store requests to location 1. The memory control logic 14 will execute the above mentioned sequence up to decision block 54. Since T1 space has previously been defined, the decision of decision block 54 is "Yes". Thereafter, the memory control logic 14 executes the decision in decision block 62 which determines if the assigned T1 area is currently in memory. Since it was previously assigned during the immediately earlier simulated memory store operation, the decision of decision block 62 is likely to be "Yes" thereby passing control to process block 58. In the event that the T1 data is no longer in memory, decision block 62 exits at "No" and control moves on to block 64 where data swapping between physical memory 16 and disk storage 28 occurs under the control of memory control logic 14. Data not currently needed in physical memory is transferred from physical memory 16 to disk storage 28 and the data desired is transferred from disk storage 28 to the physical memory 16. It will be recognized that in some implementations of the present invention, this aspect of the memory control logic 14 may in fact be performed by the Operating System thereby making decision block 62 and process block 64 unnecessary. In this case, the "Yes" exit from decision block 54 would be connected directly to process block 58.

It will next be assumed that a subsequent store request is received from the simulator 10 at a simulator time which is not in the same hypergroup as the data in T2. When this event occurs, the memory control logic 14 will follow the flow chart sequence of blocks 40, 42, 46, 52 to decision block 63 in FIG. 4 because the time of the latest storage request is not in the same hypergroup as the data in T2.

Figure 5A:
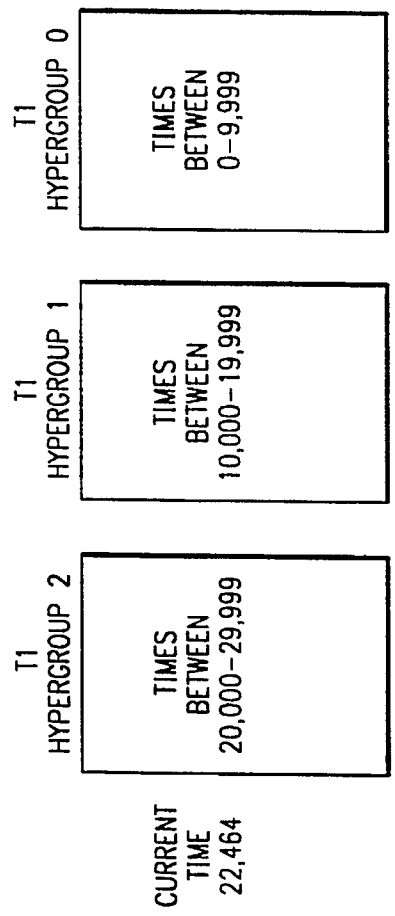
FIGS. 5A and 5B illustrate the structure of the T1 and P areas of memory.

In order to better understand the nature of hypergroups, reference is now made to FIG. 5A. FIG. 5A is intended to illustrate the status of data in physical memory at a time when the simulator 10 makes a store request during simulation cycle 22,464. By this time in the simulation, it is assumed that there have been at least one storage request during the simulation ranges of from 0–9,999, 10,000–19,999, and 20,000–29,999 cycles. Hypergroup 0 includes all the simulated memory storage requests which occurred during the simulation from cycle 0 to cycle 9,999. Hypergroup 1 includes all the simulated memory storage requests which occurred during the simulation from cycle 10,000 to cycle 19,999. Hypergroup 2 includes all the simulated memory storage requests which have occurred during the simulation from cycle 20,000 to 22,463. It will also include all those storage requests that occur from cycle 22,464 to cycle 29,999 except the last storage request for each simulated location which will remain in T2 until a subsequent storage request is generated.

Figure 5B:
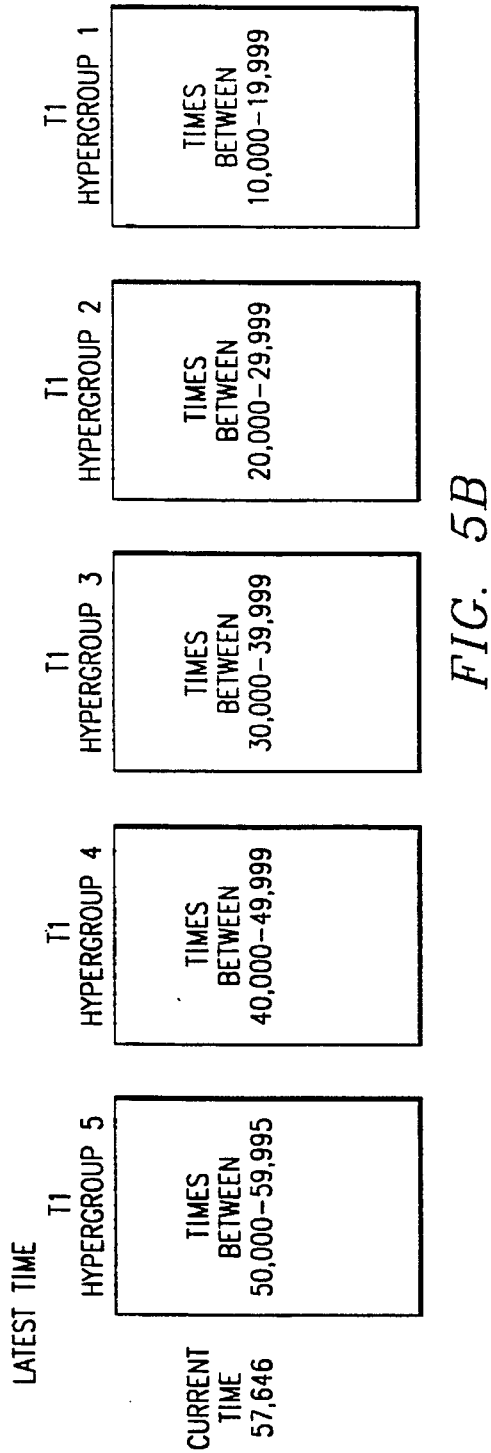

As the simulation progresses, more and more data is placed in T1 storage space which is organized into even more hypergroups as illustrated in FIG. 5B. As has already been mentioned, the preferred embodiment of the present invention calls for a maximum of five hypergroups being maintained in T1 storage with each hypergroup comprising the simulation data which was stored to simulated memory during a total of 10,000 simulation cycles. Once five hypergroups are in T1 storage space, a subsequent storage request from the simulator 10 to a different hypergroup time than the five hypergroups currently in physical memory will cause the least recently used hypergroup in T1 to be checkpointed. This is performed as illustrated in process block 44 in FIG. 2. In this case, decision block 42 determines that at least five hypergroups are in memory and a new storage request has been received with a time which is outside all the time ranges for every hypergroup in the T1 storage area of physical memory. Then process block 44 causes the least recently used hypergroup in T1 storage to be checkpointed. This means that for each address to which a simulated memory store was performed during the least recently used hypergroup, the latest occurring time value pair is moved from physical T1 storage space to physical P space. Thereafter, the physical T1 space is made available for storing the T1 data for the current hypergroup.

The only exception to the checkpointing procedure outlined above occurs in the rare situation that the latest store to a given location which is in T2 occurred at a time during the time range encompassed by a hypergroup that is being checkpointed. In this case, the most recent store to that location is maintained in T2 and all other stores to that location occurring during the hypergroup being checkpointed are freed, i.e., made available for subsequent use, and none is transferred to physical P storage space at that time.

FIG. 5B illustrates this latter status of memory allocation. In this case, hypergroup 5 contains the most recently stored T1 data associated with time value pairs stored during simulator cycles 50,000–59,999. The data maintained in physical memory after hypergroup 0 has been checkpointed is maintained in the physical area designated P0. It will be noted that the area occupied by P0 is smaller than the area that was previously occupied by hypergroup 0 in T1 space due to the fact that only the latest time value pair is moved from T1 storage space to P storage space and the pointer associated therewith is set to nil.

Returning now to FIG. 4, decision block 63 decides if the simulation time for the data in T2 where the current request will be stored is in the time range of a hypergroup currently in T1 memory. If this is the case (a "Yes" answer), the memory control logic 14 executes the process in process block 65 which moves the time value pair and the associated pointer in T2 to the T1 space for the hypergroup containing the simulation time in that time value pair. Then control passes to process block 50 in FIG. 2 where the current data is stored into the T2 space which was just freed of prior data and the associated pointer set to point to the location of the data previously moved from the T2. Thereafter, the memory control logic 14 reverts to a wait state.

In some instances, storage requests to some simulated memory locations may occur at very infrequent times where a very large number of simulator cycles occur between store requests to that location. In this case, the simulator time stored in T2 may not fall in the range of times of any of the hypergroups currently in memory resulting in a "No" answer to decision block 63. In this case, the memory control logic 14 moves on to decision block 66. Decision block 66 calls for the memory control logic 14 to determine if the checkpointed hypergroup containing the simulation cycle in which the previous store occurred (to the location in question which resides in T2) is currently in P storage in memory. If the answer to this question is "No", then the memory control logic 14 must make physical space available according to control block 68 in memory and fetch the checkpointed hypergroup from the disk storage unit 28 and place it into the P storage area of memory. Thereafter, the memory control logic 14 moves on to process block 70. In the event that decision block 66 is answered "Yes", control passes directly to block 70.

As already noted above with respect to process block 64, process block 68 may be unnecessary in some systems as the operating system may operate to assure that the pages containing the desired data are in physical memory and the memory control logic 14 may not need to check for its presence or to fetch it from disk storage if it is not present.

In process block 70, the time value pair in T2 is moved to the checkpointed hypergroup in the physical P storage area of memory 16. At the same time, the pointer associated therewith in P is set to nil. Then control passes to process block 50 where the current storage request time value pair is stored into T2 and a pointer is set to the address in T1 where the date previously found in T2 has just been moved.

It has been noted above that the P storage area includes a checkpointed hypergroup of time value pairs and an associated pointer. Since the P storage area includes only a maximum of one time value pair for each simulated memory location written to during the checkpointed hypergroup, there is really no need for a pointer in the P storage area. In the present invention it is utilized as an economy as it is always desired to associate a pointer with a time value pair thereby making the logic for the memory control simpler by not having to provide logic to decide if it is not needed in a particular case. However, as a measure to further preserve memory space and particularly P storage space, the logic to avoid having a pointer associated with each time value pair stored in P storage space could easily be implemented.

The above description has been presented with particular emphasis on the embodiment illustrated in the figures. The actual construction of a device to perform the functions outlined herein is one which would be routine for either a hardware or software designer as the invention can be easily implemented in either hardware or software. Those of skill in the art of the invention will readily recognize the described invention may be modified in many ways, including but not limited to the ways already described, without departing from the spirit and scope of the present invention which is defined by the following claims.

What is claimed is:

1. A method for processing historical data of simulated memory writes which occur during a simulation of a logic network including at least one memory, the method comprising the steps of:

segmenting a physical memory for storing time value pairs of data to be stored by a simulator at a simulated address in each memory being simulated, said physical memory being segmented into a T2 storage area, a T1 storage area and a P storage area, said T2 storage area for storing the most recent time value pair written to each simulated memory location, said T1 storage area for storing all the previous time value pairs written to each simulated memory address during each of the most recently executed B blocks of A simulator cycles, where A and B are integers, said T1 storage area including the block of simulator cycles which includes the latest simulator cycle, said P storage area for storing the most recent time value pair written to each simulated memory storage location during each block of A cycles which was checkpointed out of said T1 storage area provided the most recent write to a given simulated memory location during a given block of A cycles is not the most recent write to that location, each said time value pair having associated therewith a pointer which identifies the location of the time value pair for the next preceding time value pair remaining in physical memory;

receiving from a simulator a simulated memory storage request which includes a simulated memory address to which simulated memory data is to be stored and a time value pair comprising a simulator time identifying the simulation cycle during which the write occurred and the data value to be stored at said simulated memory address;

storing, in response to each said simulated memory storage request, the most recently received time value pair from said simulator in said T2 storage area; and, in the event a prior store had occurred to the same simulated memory location, storing the time value pair and a pointer associated therewith for that prior store in the portion of said T1 and P storage area containing other time value pairs occurring during the same block of A simulator cycles and setting a pointer associated with the time value pair in T2 storage area to the address of the time value pair stored in said T1 and P storage area from said T2 storage area.

2. A method for processing historical data of simulated memory writes which occur during a simulation of a logic network including at least one memory, the method comprising the steps of:

segmenting a physical memory for storing time value pairs of data to be stored by a simulator at a simulated address in each memory being simulated, said physical memory being segmented into a T2 storage area, a T1 storage area and a P storage area, said T2 storage area for storing the most recent time value pair written to each simulated memory location, said T1 storage area for storing all the previous time value pairs written to each simulated memory address during each of the most recently executed B blocks of A simulator cycles, where A and B are integers, said T1 storage area including the block of simulator cycles which includes the latest simulator cycle, said P storage area for storing the most recent time value pair written to each simulated memory storage location during each block of A cycles which was checkpointed out of said T1 storage area provided the most recent write to a given simulated memory location during a given block of A cycles is not the most recent write to that location, each said time value pair having associated therewith a pointer which identifies the location of the time value pair for the next preceding time value pair remaining in physical memory;

receiving from a simulator a simulated memory storage request which includes a simulated memory address to which simulated memory data is to be stored and a time value pair comprising a simulator time identifying the simulation cycle during which the write occurred and the data value to be stored at said simulated memory address;

storing, in response to each said simulated memory storage request, the most recently received time value pair from said simulator in said T2 storage area;

in the event a prior store had occurred to the same simulated memory location, storing the time value pair and a pointer associated therewith for that prior store in the portion of said T1 and P storage area containing other time value pairs occurring during the same block of A simulator cycles and setting a pointer associated with the time value pair in T2 storage area to the address of the time value pair stored in said T1 and P storage area from said T2 storage area; and, in the event that the time value pair stored in said T2 storage area is the first such store for a given address during the simulation, setting the pointer associated therewith to nil.

3. A method for processing historical data of simulated memory writes which occur during a simulation of a logic network including at least one memory, the method comprising the steps of:

segmenting a physical memory for storing time value pairs of data to be stored by a simulator at a simulated address in each memory being simulated, said memory being segmented into a T2 storage area, a T1 storage area and a P storage area, said T2 storage area for storing the most recent time value pair written to each simulated memory location, said T1 storage area for storing all the previous time value pairs written to each simulated memory address during each of B blocks of A simulator cycles, where A and B are integers, said T1 storage area including the block of simulator cycles which includes the most recently executed simulator cycle during which a store request was generated by the simulator, said P storage area for storing the most recent time value pair written to each simulated memory storage location during each block of A cycles which was checkpointed out of said T1 storage area provided the most recent write to that location during a given block of A cycles is not the most recent write to that location;

receiving from a simulator a simulated memory address to which simulated memory data is to be stored and a time value pair comprising a simulator time identifying the simulation cycle during which the simulated write occurred and the data value to be stored at said simulated memory address;

comparing said simulator time with the time range for each block of stored simulator memory write requests previously stored in said T1 storage area and if said simulator time received from said simulator is greater than the time range in each of N blocks of stored memory write requests in T1, causing the least recently used block of stored memory write requests in said T1 storage area to be checkpointed into said P storage area;

transferring the time value pair and a pointer associated therewith that were previously stored in said T2 area to the area in said T1 and P storage areas containing time value pairs stored in the same block of A simulator cycles that encompass the time in said time value pair in said T2 storage; and storing the most recently received time value pair from said simulator in said T2 storage area and setting a pointer associated therewith to the address in T1 and P storage area where the data previously in T2 was transferred.

4. The method of claim 1 wherein B is 5 and A is 10,000.
5. The method of claim 2 wherein B is 5 and A is 10,000.
6. The method of claim 3 wherein B is 5 and A is 10,000.
7. The method of claim 1 additionally including the step of responding to read requests from said simulator comprising a storage location and read indication to access the location in T2 for storing the data previously stored at the location being requested to be read.
8. The method of claim 2 additionally including the step of responding to read requests from said simulator comprising a storage location and read indication to access the location in T2 for storing the data previously stored at the location being requested to be read.
9. The method of claim 3 additionally including the step of responding to read requests from said simulator comprising a storage location and read indication to access the location in T2 for storing the data previously stored at the location being requested to be read.

* * * * *